US010495698B2

(12) United States Patent
Jeske et al.

(10) Patent No.: US 10,495,698 B2
(45) Date of Patent: *Dec. 3, 2019

(54) MAGNETO-ENCEPHALOGRAPHY DEVICE

(71) Applicant: Royal Melbourne Institute of Technology, Melbourne (AU)

(72) Inventors: Jan Jeske, Fitzroy North (AU); Andrew Greentree, Fawkner (AU); Jared Cole, North Coburg (AU)

(73) Assignee: Royal Melbourne Institute of Technology, Melbourne (AU)

(*) Notice: Subject to any disclaimer, the term of this patent is extended or adjusted under 35 U.S.C. 154(b) by 63 days.

This patent is subject to a terminal disclaimer.

(21) Appl. No.: 15/748,117

(22) PCT Filed: Jul. 27, 2016

(86) PCT No.: PCT/AU2016/050667
§ 371 (c)(1),
(2) Date: Jan. 26, 2018

(87) PCT Pub. No.: WO2017/015712
PCT Pub. Date: Feb. 2, 2017

(65) Prior Publication Data
US 2018/0259597 A1 Sep. 13, 2018

Related U.S. Application Data

(63) Continuation-in-part of application No. 14/879,769, filed on Oct. 9, 2015, now Pat. No. 10,082,545.

(30) Foreign Application Priority Data

Jul. 28, 2015 (AU) .................................. 2015903002
Sep. 25, 2015 (AU) .................................. 2015230816

(51) Int. Cl.
*G01R 33/032* (2006.01)

(52) U.S. Cl.
CPC .................................. *G01R 33/032* (2013.01)

(58) Field of Classification Search
USPC ...................................................... 324/244.1
See application file for complete search history.

(56) References Cited

U.S. PATENT DOCUMENTS 5,781,513 A 7/1998 Fuji
8,896,302 B1 11/2014 Zhu et al.
(Continued)

FOREIGN PATENT DOCUMENTS

EP 2685274 A1 1/2014
WO 2007078889 A2 7/2007

OTHER PUBLICATIONS

Gopalakrishnan, Balasubramaniaan, et al. "Nanoscale imaging magnetometry with diamond spins under ambient conditions", Nature, vol. 455, Oct. 2, 2008 (5pgs.).
C.L. Degen, "Scanning magnetic field microscope with a diamond single-spin sensor", IBM Research Division, Almaden Research Center, Sep. 23, 2008 (4 pgs.).
(Continued)

*Primary Examiner* — Jay Patidar
(74) *Attorney, Agent, or Firm* — Lee Sullivan Shea & Smith LLP

(57) ABSTRACT

A magneto-encephalography device including a plurality of laser threshold magnetometers for measuring a magnetic field is provided. Each laser threshold magnetometer includes an optical cavity, a laser medium which together with the optical cavity has a laser threshold; a laser pump; and a radio-frequency (RF) drive applied to the laser medium at or around a particular resonance frequency which varies depending on the magnetic field, such that depending on the value of the physical parameter, the RF drive induces transitions between at least two states of the laser medium, each state causing a different laser threshold in an intensity of a laser output, wherein the intensity of the laser output provides a measurement of the magnitude of the magnetic (Continued)

field; wherein the laser threshold magnetometers are configured to be placed on a head of a subject to be monitored.

10 Claims, 2 Drawing Sheets

(56) References Cited

U.S. PATENT DOCUMENTS

| | | |
|---|---|---|
| 2005/0201715 A1 | 9/2005 | Ellwood, Jr. |
| 2007/0014392 A1 | 1/2007 | Madey et al. |
| 2007/0167723 A1 | 7/2007 | Park et al. |
| 2009/0185586 A1 | 7/2009 | Jhung et al. |
| 2010/0315079 A1* | 12/2010 | Lukin .............. G01R 33/032 324/244.1 |
| 2014/0061510 A1 | 3/2014 | Twitchen et al. |
| 2014/0072008 A1 | 3/2014 | Faraon et al. |
| 2014/0121491 A1 | 5/2014 | Zhang |
| 2014/0320863 A1 | 10/2014 | Christensen et al. |
| 2014/0354275 A1 | 12/2014 | Sheng et al. |
| 2015/0001422 A1 | 1/2015 | Englund et al. |
| 2016/0223621 A1 | 8/2016 | Kaup et al. |
| 2016/0231394 A1 | 8/2016 | Manickam et al. |
| 2016/0266110 A1 | 9/2016 | Ozdemir et al. |
| 2016/0282427 A1 | 9/2016 | Heidmann |
| 2016/0356863 A1 | 12/2016 | Boesch et al. |

OTHER PUBLICATIONS

Marcus W. Doherty et al., "The nitrogen-vacancy colour centre in diamond", Physics reports 528, Feb. 26, 2013, 1-45.
J.M. Taylor et al., "High-sensitivity diamond magnetometer with nanoscale resolution", nature physics, vol. 4, Oct. 2008, 810-816.
Jeske, et al. "Laser threshold magnetometry," New J. Phys. 18, 013015, Oct. 23, 2014, 14 pages.
European Patent Office, European Extended Search Report issued in EP application No. 16829499.9 dated Feb. 26, 2019, 8 pages.
Jeske, et al. "Laser threshold magnetometer reaching attotesla precision," Quantum Physics, http://arXiv.org/odf/1410.6239v1. pdf, Oct. 23, 2014, 11 pages.
International Searching Authority, International Search Report and Written Opinion dated Oct. 10, 2016, in connection with International Application No. PCT/AU2016/050667, 9 pages.
Jeske, Jan et al. "Laser Threshold Magnetometer Reaching Attotesla Precision." Chemical and Quantum Physics, School of Applied Sciences, RMIT University, Australia, Oct. 23, 2014, [retrieved online at https://arxiv.org/pdf/1410.6239v1.pdf], 11 pages.
Jeske, Jan et al. "Laser Threshold Magnetometer Reaching Attotesla Precision." Chemical and Quantum Physics, School of Applied Sciences, RMIT University, Australia, Oct. 23, 2014, [retrieved online at Cornell University Library at https://arxiv.org/abs/1410. 6239v1],11 pages.

* cited by examiner

MAGNETO-ENCEPHALOGRAPHY DEVICE

CROSS-REFERENCE TO RELATED APPLICATIONS

The application claims priority to PCT/AU2016/050667, which was filed on Jul. 27 2016, which claims priority to AU 2015903002, which was filed on Jul. 28, 2015, AU 2015230816, which was filed on Sep. 25, 2015, and U.S. application Ser. No. 14/879,769, which was filed on Oct. 9, 2015, the contents of each of which is incorporated by reference in their entirety.

TECHNICAL FIELD

The present invention relates to a magneto-encephalography device for measuring and monitoring the magnetic fields produced by brain activity in a subject. More particularly, the magneto-encephalography device is based on one or more laser threshold sensors.

BACKGROUND OF INVENTION

Magneto-encephalography (MEG) is a non-invasive neuroimaging technique for mapping brain activity. Recording probes are placed on the surface of the skull to record activity occurring on the surface of the brain. Using triangulation techniques, brain activity detected by the probes can be mapped in three dimensions.

Electromagnetic fields are generated in the brain by the flow of ionic currents through neurons during synaptic transmission. Whilst the magnitude of the electromagnetic field associated with individual neurons is typically negligible, the effects of many neurons (e.g. 50,000 to 100,000) excited together in a specific area of the brain generate a measureable electromagnetic field. Since neuro-magnetic signals generated by the brain are weak (typically 10 fT to 1 pT at the point of detection), highly sensitive magnetometers are required in order to detect and locate the neuro-magnetic signals precisely.

SQUID (superconducting quantum interference device) sensors are state of the art sensors currently used for Magneto-encephalography applications. Whilst SQUID sensors are highly sensitive, a considerable drawback to their application is that SQUID sensors require cryogenic cooling. Moreover, since SQUID sensors operate at cryogenic temperatures (typically below 10K), they cannot be placed directly on the skull, without some form of temperature insulation. As a result, of this separation, the neuro-magnetic signals are not as clear as they could be if the sensors were able to be positioned directly on the skull. Moreover, cryogenic cooling is typically performed with liquid helium which is both an expensive and a finite resource, which is projected to be exhausted in 20 years. Accordingly, there is a strong need for a highly sensitive sensor that can be operated at room temperatures.

A reference herein to matter which is given as prior art is not to be taken as an admission that that document or matter was known or that the information was part of the common general knowledge as at the priority date of any of the claims.

SUMMARY OF INVENTION

According to an aspect of the present invention, there is provided a magneto-encephalography device including a plurality of laser threshold magnetometers for measuring a magnetic field, each laser threshold magnetometer including an optical cavity, a laser medium which together with the optical cavity has a laser threshold; a laser pump; and a radio-frequency (RF) drive applied to the laser medium at or around a particular resonance frequency which varies depending on the magnetic field, such that depending on the value of the magnetic field, the RF drive induces transitions between at least two states of the laser medium, each state causing a different laser threshold in an intensity of a laser output, wherein the intensity of the laser output provides a measurement of the magnitude of the magnetic field; wherein the laser threshold magnetometers are configured to be placed on a head of a subject to be monitored.

The plurality of laser threshold magnetometers are preferably configured to be placed directly on the head of the subject in use.

In one embodiment, the plurality of laser threshold magnetometers are configured to be individually placed directly on the head of the subject. That is, the laser threshold magnetometers are positioned over at least a portion of the subject's head one at a time.

In an alternative embodiment, the plurality of laser threshold magnetometers are arranged in an array within a shell having an inner surface and an outer surface, the inner surface being shaped to substantially surround at least a portion of the head of the subject. This enables the device to be placed on the head of a subject to be monitored in a substantially single action.

Each laser threshold magnetometer is preferably configured to measure the magnetic field proximal to the location of the laser threshold magnetometer on the head of the subject and yields the laser output specific to that location. Using triangulation techniques, the brain activity detected by the sensor can be mapped in three dimensions.

The intensity of the laser output may be representative of the strength and/or direction of the magnetic field at the location of the laser threshold magnetometer on the head of the subject.

According to a preferred embodiment, each laser threshold magnetometer is directly coupled to an optical fibre, such that the laser output is guided into the optical fibre. The optical fibres from the plurality of laser threshold magnetometers may guide the laser output to at least one light sensor, which measures the intensity of the laser output.

According to one particular embodiment, the laser threshold magnetometers are pumped via the laser pump through the same optical fibre, which guides the laser output.

In one form of the invention, at least part of the optical cavity of the laser threshold magnetometer is provided by the optic fibre itself.

BRIEF DESCRIPTION OF DRAWINGS

Embodiments of the present invention will now be described by way of example only, with reference to the accompanying drawings. It is to be understood that the particularity of the drawings does not supersede the generality of the preceding description of the invention.

DETAILED DESCRIPTION

Figure 1:
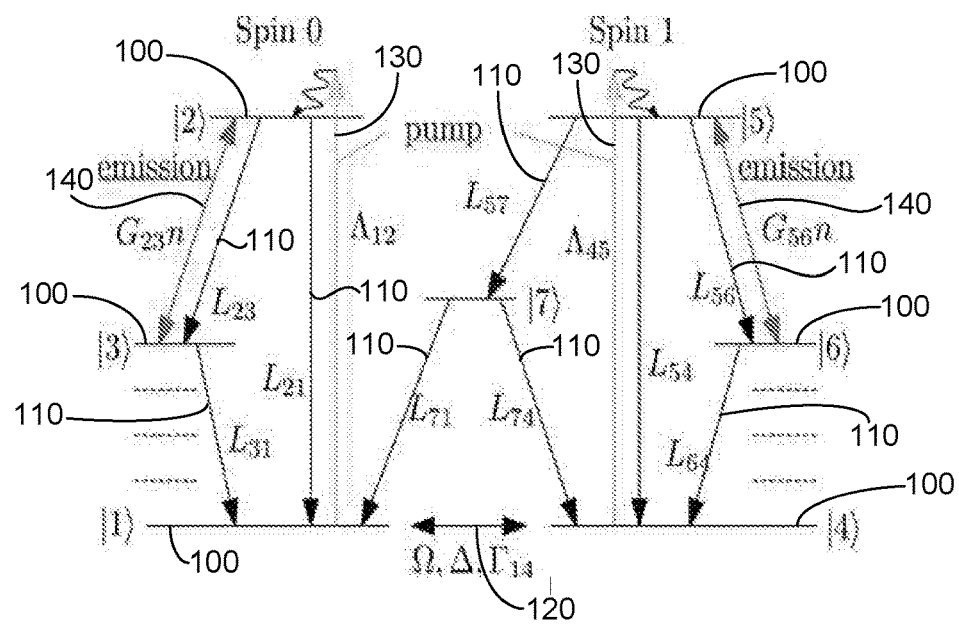
FIG. 1 is a schematic representation of the states of an example of a suitable laser medium for forming a laser threshold sensor for use in an embodiment of the present invention.

The present invention is directed to a magneto-encephalography device which is based on one or more laser threshold sensors. The construction and operation of a laser threshold magnetometer is described below. Additional detail is provided in co-pending U.S. patent application Ser. No. 14/879,769 filed on 9 Oct. 2015 to RMIT University.

A laser consists of at least a laser medium, a cavity and a laser pump, which is typically a light source, typically in or close to the visible range or electrical pumping, which is applied to the laser medium. The laser pump lifts single atoms or single colour centres of the laser medium into an energetically higher lying excited state. From this excited state the laser medium returns to an energetically lower lying state; the energy difference is emitted as light (a photon). The photon is created with a wavelength and energy corresponding to that energy difference of the two states. The lower lying energy state has multiple states slightly higher in energy because they have an additional phonon (vibrational quantum). Since transitions can also go from the higher lying state to these phonon-added states the photon that is created can have a range of different wavelengths, the so-called phonon sidebands. Spontaneous emission emits photons over this range of wavelength. Stimulated emission emits photons in only one wavelength (i.e. a much smaller range of wavelengths), namely that wavelength of the strong field which creates stimulated emission. This wavelength corresponds to one particular transition in the laser medium. This transition is called the lasing transition.

The process of pumping to an excited state followed by the emission of a photon is continuously repeated by the atoms or colour centres of the laser medium. The photon emission can either be spontaneous emission or stimulated emission. Stimulated emission occurs when a light field interacts with the atom or colour centre and is more likely the stronger the light field; the emitted photon under stimulated emission has the same wavelength, phase and spatial mode as the strong light field. The laser cavity essentially consists of at least two mirrors surrounding the laser medium, one of which is partially transmitting. The emitted light is reflected back and forth between the mirrors and builds up a light field which in turn creates stimulated emission. This light field continuously gains photons from the laser medium but also continuously loses photons due to the partially transmitting mirror. Lasing is achieved, when the stimulated emission becomes strong enough to counteract the cavity loss and builds up a strong light field inside the cavity. For a given number of atoms or colour centres and a given transmittance of the mirror, there is a minimal strength of the laser pump needed to achieve lasing. This is called the laser threshold or lasing threshold. When the laser pump strength is above the laser threshold lasing is achieved, i.e. the laser turns on. This is because the light field inside the cavity is strong and creates stimulated emission. Some of this light is transmitted through the partially transmitting mirror and creates the laser beam of light, i.e. the laser output.

An atom or colour centre has separate states with different energies. A transition between at least two states can be induced by applying electromagnetic waves to the atom or colour centre, with a frequency which corresponds to the energy difference between those states. Since inducing transitions is dependent on applying a particular frequency it is a resonance phenomenon. Transitions between states with different spin are typically induced by frequencies in the radio-frequency (RF) range. This is called magnetic resonance. States with different spin also have an energy difference (and hence a resonance frequency) which is dependent on an external magnetic field. Inducing transitions is therefore dependent both on the frequency and the external magnetic field. Magnetic resonance is used widely for example in medical imaging and spectroscopy. When the two different spin states have a different brightness under excitation from another pump light source, then the transitions can be detected by measuring the brightness. This is called optically detected magnetic resonance (ODMR). Conventionally, ODMR is based purely on spontaneous emission.

A laser threshold magnetometer combines the principles of lasing and magnetic resonance to create a magnetometer with exceptional sensitivity. A laser with a particular laser medium is combined with an RF drive in such a way that the laser threshold shifts when the external magnetic field changes.

A suitable laser medium must satisfy three requirements. The first requires that the laser medium has at least two states with an energy difference which changes with the external magnetic field to be measured (or more generally: with the external quantity to be measured). For example different spin states have an energy difference which changes with the magnetic field. The RF drive is applied to the transition between these states.

The second requires that the at least two states which are addressed by the RF drive result in different brightness from their respective excited states under laser pumping. The difference in brightness means that depending on the resonance of the RF drive there are different gains into the cavity, which shifts the laser threshold.

The third requires that the laser pump together with the internal decay structure of the laser medium drives the laser medium preferentially into one of the two RF addressed states which have different brightness. This way the laser pump and the RF drive work against each other and off-resonant RF driving results in the laser medium being driven into the preferential state (which is defined by the laser pump and the internal decay structure) rather than staying in an arbitrary state. Only on-resonant RF driving creates a transition into the non-preferential state. The third feature is often equivalent to (and therefore present in materials which have) a mechanism of optical initialisation in the context of qubit transitions.

Solid-state materials are usually a good choice for the laser medium due to their density of emitters, thermal capacity, ease of fabrication and robustness. One example of a suitable solid-state laser medium satisfying the foregoing requirements is a nitrogen-vacancy colour centre (NV centres) in a diamond crystal. This is a diamond impurity that can be naturally found, or more commonly grown into synthetic diamonds. The suitability of the NV centre as a laser medium is due to the fact that the parameters of the NV centre are well defined and it has a spin dependent fluorescence, i.e. it emits different amounts of light depending on the spin state it is in. In the NV centre the $m_s=0$ spin manifold is brighter than the $m_s=\pm 1$ spin manifolds and the NV centre is driven into the $m_s=0$ spin state by a laser pump together with the internal decay structure.

The laser threshold is determined by the number of photons which are emitted on the lasing transition relative to the number of photons lost from the cavity. The fraction of photons lost is determined by the transmittance of the mirrors and unwanted scattering processes. The number of photons emitted on the lasing transition is determined by the number of atoms or colour centres, the strength of the laser pump and the probability of photon emission into the cavity mode (i.e. the brightness of the lasing transition) of one atom or colour centre for a given laser pump strength. That means that the laser threshold changes when the brightness of the laser medium on the lasing transition changes (for fixed laser pump strength).

An external magnetic field changes the energy difference, i.e. resonance frequency between two states. If the RF drive frequency is fixed, the external magnetic field shifts the RF drive on and off resonance, which determines the relative probability of the state that the laser medium is predominantly in. The different states are associated with different brightness, which creates a different lasing threshold. Therefore the lasing threshold changes with the external magnetic field. This means that the laser output provides a measurement of the magnetic field.

A measurement can be obtained in different ways. One way is to sweep through the RF frequency and to record the laser output as a function of the RF frequency. This provides a plot with at least one resonance peak (or dip, i.e. inverted peak). The position of that at least one peak yields information about the magnetic field (or more generally the quantity to be measured). In cases where there are several peaks their relative position, height and width can provide further information. For example for laser media with branching ratios, which depend on the orientation of the magnetic field the relative height of different peaks can yield precise information about the orientation of the magnetic field. Sweeping the RF frequency has the advantage of recording a spectral profile, which can either be advantageous to determine a resonance frequency to very high precision or is particularly advantageous, in cases where the additional information is in the spectral profile, such as cases with several peaks. Another way of obtaining a measurement is by fixing the RF drive to a certain frequency. This has the advantage, that the laser output measurement can be obtained either much faster (since it is not necessary to scan the RF frequency range) and/or to higher precision at the fixed RF frequency (since the laser output intensity can be measured for longer).

Referring now to FIG. 1, there are shown the states 100 of an NV centre, which is an exemplary laser medium for laser threshold magnetometry. The vertical height implies the relative energy level of the state 100. The downwards pointing arrows 110 represent internal decay rates of the NV. States 1, 2, 3 are the ms=0 spin manifold, states 4, 5, 6 are the ms=1 (or −1) manifold. The RF drive addresses transitions between states 1 and 4 (two-way horizontal arrow 120). The laser pump lifts the NV from the lower lying energy state 1 or 4 to the excited state 2 and 5 (upwards arrows 130), often via phonon-added states above 2 and 5. Above the ground states (1 and 4) there are several phonon-added states (indicated by dotted lines and states 3 and 6). The lasing transition (arrows 140) is chosen between the excited state and a phonon-added state. The intrinsic asymmetry created by the transitions L57 and L71 ensures that under continuous laser pumping (without the RF drive) the system is driven towards the spin 0 manifold. The decay rate L57 also means that the likelihood of emitting a photon from state 5 is lower than from state 2, i.e. that the spin manifolds have different brightness.

Figure 2:
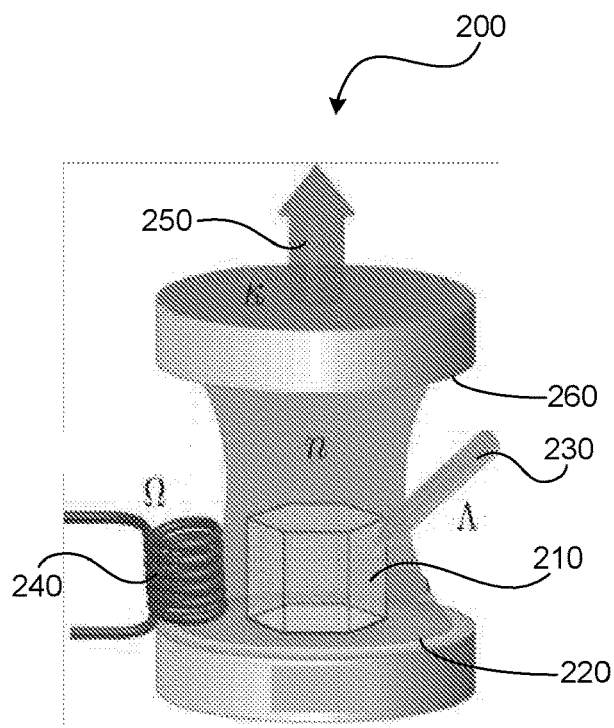
FIG. 2 is a schematic representation of a laser threshold sensor.

Referring now to FIG. 2, there is shown the configuration of a laser threshold sensor 200 showing the primary components. A laser medium 210 is positioned inside a cavity 220, a laser pump 230, an RF drive 240 (e.g. a wire or coil). Above the laser threshold, stimulated emission from the laser medium occurs. At equilibrium there are n photons of the same wavelength, emitted from the lasing transition occurring inside the cavity 220. A partially transmitting mirror 260 lets a certain fraction of the photons escape the cavity 220. These escaping photons form the laser beam 250, i.e. the laser output.

To achieve lasing, a population inversion is necessary, i.e. the laser medium 210 needs to be more likely in the upper state of the lasing transition than the lower state of the lasing transition. The fast spontaneous decay from the excited state to the ground state in many laser media 210 makes population inversion on the transition between the excited and ground state very difficult because the laser pump 230 has to be strong enough to counteract the spontaneous decay. To achieve lasing, the lasing transition can be chosen to be between the excited state and a phonon-added ground state. This means that for lasing population inversion between the phonon-added ground state and the excited state is necessary instead of population inversion between the absolute ground state and the excited state. Since the phonons decay very quickly the population in the phonon-added ground state is very small and population inversion can be achieved much more easily. In the NV centre for example this is the case (see FIG. 1). The lasing transition is ideally chosen between the excited state and that phonon-added ground state which has the strongest transition, i.e. is the brightest. This transition is given by the peak of the phonon-sideband, which for the example of an NV centre is at approximately 700 nm and corresponds to the three-phonon-added ground state.

The NV centre laser pumping occurs from the electronic ground state triplet $^3A_2$ to the electronic excited state triplet $^3E$, where $A_1$, $A_2$, and E refer to the group theoretical irreducible representations of the $C_{3V}$ symmetry group of the NV centre. The states with different levels of brightness are at least two out of the three states of the ground state triplet $^3A_2$. At least one of the transitions between the 3E states and the phonon-added states of the $^3A_2$ are used as a lasing transition.

Figure 3:
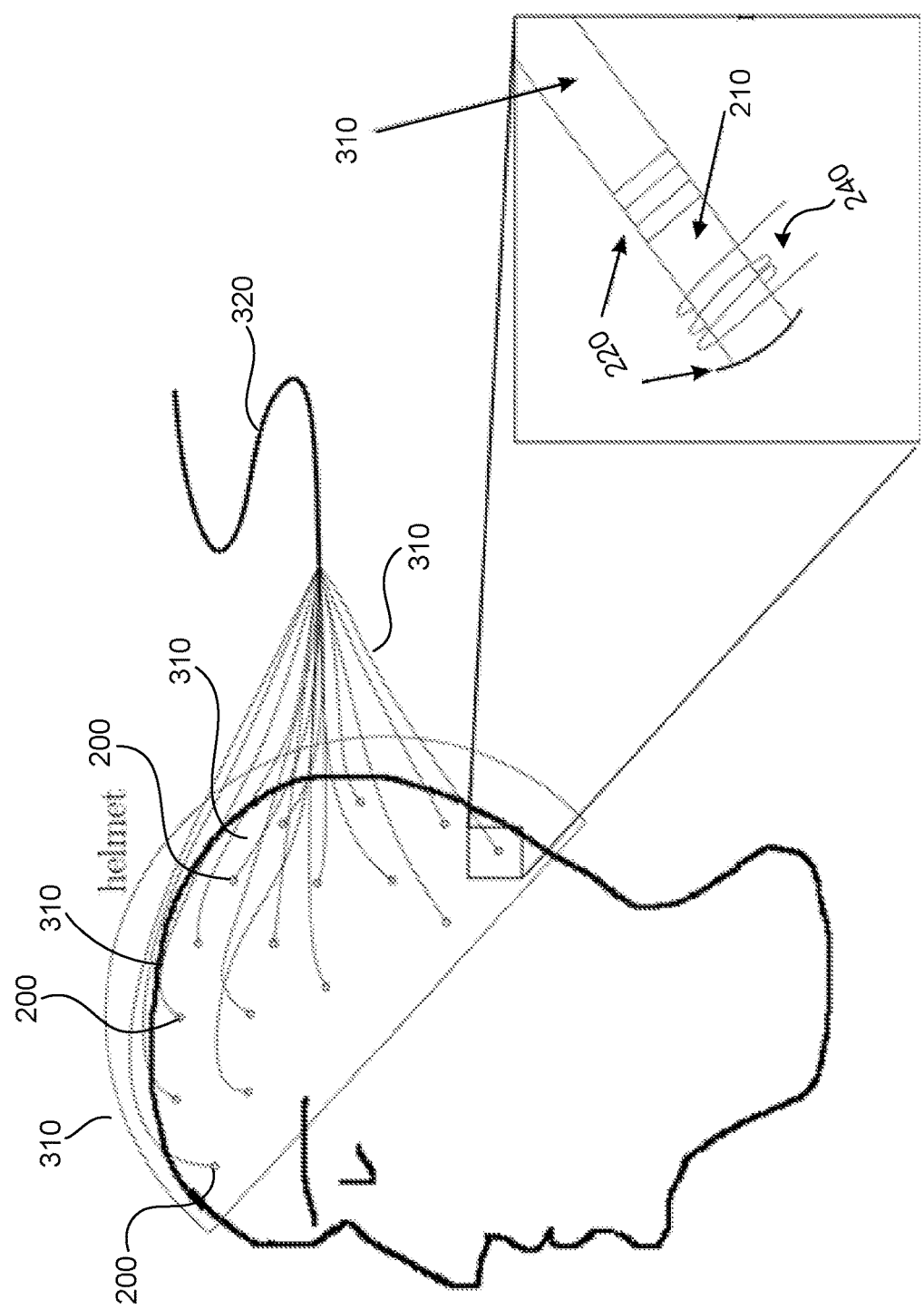
FIG. 3 is a schematic representation of a plurality of laser threshold magnetometers placed on a subject's skull according to an embodiment of the present invention.

Referring now to FIG. 3, each laser threshold sensor (or magnetometer) 200 is coupled to an optical fibre 310. The plurality of optical fibres 310 are bundled together 320 and directed to light detectors (not shown). The enlargement shows the detail of a laser threshold magnetometer 200, which sits at the end of an optical fibre 310 such that the optical cavity 220 couples to the optical fibre for both the laser pump 230 and the laser output 250 (see FIG. 2). Inside the optical cavity 220 is the laser medium 210. An RF drive 240 delivers radio-frequency electromagnetic waves to the laser medium 210.

A laser threshold magnetometer can be operated at room temperature and therefore can be placed directly onto the head of a subject to be monitored. Unlike SQUID sensors, laser threshold magnetometers do not require any accompanying support structure to ensure safe cryogenic cooling. This makes laser threshold magnetometers significantly more versatile. Individual laser threshold sensors can be placed on the head of the subject to allow the sensor array to be varied dependent on particular applications. For example the International 10-20 system for application of scalp electrodes in the context of electro encephalography (EEG) is feasible as well as various other arrangements of the sensors.

Alternatively the sensors can be configured in a fixed array in a shell- or helmet-type device. This allows very high spatial resolution by using a large number of sensors. This type of device further allows all of the sensors to be placed on the skull and removed from the skull very easily, i.e. in a single action.

Laser threshold magnetometers provide very good sensitivity with only a small detection volume (for example 1 mm$^3$). In contrast, SQUID devices typically cover a larger area (for example 28×28 mm$^2$) on the subject's head. Laser threshold magnetometers therefore offer enhanced spatial resolution and a higher density of laser threshold magnetometers can be placed on the head.

Each laser threshold magnetometer has its own output in the form of laser light. This output can be directly coupled into an optical fibre as described with reference to FIG. 3. This has the advantage that the output from each laser threshold magnetometer can be guided through an optical fibre, rather than an unguided laser beam. Each laser threshold magnetometer can have a separate optical fibre, meaning there are as many optical fibres as there are laser threshold magnetometers that comprise the device. These optical fibres are known as output channels.

The fibre-coupling can be achieved by placing the end of the optic fibre directly behind the partially transmitting mirror 260 (See FIG. 2) of the laser threshold magnetometer. Alternatively the design of the laser threshold magnetometer can be changed such that the parts of or the whole cavity is provided by the optical fibre itself. The surface of the end of the optical fibre itself can become the partially transmitting mirror and therefore forms one end of the optical cavity. A concave surface at the end of the fibre is useful in this case to achieve stable cavities and can be achieved for example by shots of a pulsed CO2 laser. The mirror can then be created for example by coating the surface with dielectric layers. Alternatively the reflection at the end of the optical fibre can be minimised and reflection can be arranged by a structure within the optic fibre, such as a fibre Bragg grating. A further alternative is that the laser medium for the laser threshold magnetometer could be integrated into the optical fibre and surrounded by reflecting structures, such that the fibre itself provides the whole optical cavity. For example a fibre Bragg grating on both sides could provide the optical cavity.

If the laser pump is provided by light then this laser pump light can be conveniently provided into the cavity through the optical fibre. In that case the optical cavity should be resonant with the pump laser light (as well as the emission from the laser medium) to enable the laser pump light to enter the optical cavity and to be amplified for cases where the laser medium is not strongly absorbing. If the cavity is made of mirrors with a wavelength dependence such as a fibre Bragg grating then two cavities (one inside the other) which are tuned to the pump wavelength and the emission wavelength respectively are a possible configuration.

The laser light from each output channel can be directed to a standard light or photon detector, such as an avalanche photodiode or charge-coupled device, where it can be measured precisely. This measurement can either be total light strength (i.e. total number of photons) or it can be measured spectrally resolved. For a total photon number measurement a wavelength filter such as a notch, short pass or long pass (depending on the relative wavelengths) can ensure that no pump light gets into the detector and only the desired output signal is measured. A spectrally resolved measurement allows clearly distinguishing different wavelengths and therefore distinguishing light on the pump wavelength, the emission wavelength or any other wavelength such as light from surrounding light sources. Highest precision in the light measurement is achieved when the number of photons per time is determined. To ensure that the detectors don't saturate the measurement signal can be divided up and measured by more than one detector. The digital signal from each detector can then be passed to a computer for display, storage and further manipulation such as the above mentioned triangulation techniques.

For a single measurement of the magnetic field at the position of one laser threshold magnetometer, the corresponding output channel is measured for a particular measurement time, i.e. the number of photons over the measurement time is recorded. This yields a value for the magnetic field which is more precise for longer measurement times. The measurement time also defines the time resolution of the measurement because a single measurement is obtained for every measurement time. This means one can increase the precision by decreasing the time resolution and vice versa. The precision $p \propto \sqrt{(t_m)}$ in Tesla scales with the square root of the measurement time. The sensitivity of the laser threshold magnetometer determines the precision for a set measurement time.

High precision from each laser threshold magnetometer is advantageous for the computational process of determining the precise origin of a brain signal in 3D from the 2D array of signals on the surface of the head. Therefore higher spatial resolution can be achieved by higher precision. Higher precision can in turn be achieved at the cost of lower time resolution.

To measure the small and potentially quickly-changing external magnetic fields produced by the brain, the RF drive of the laser threshold magnetometer can be detuned to the point where the laser output signal changes the strongest for a given small change in the magnetic field to be measured. This is the point where the derivative of the laser output signal with respect to the magnetic field to be measured is the strongest. This detuning also ensures that the direction (positive or negative) as well as the magnitude can be measured because a positive or negative magnetic field lead to an increase or decrease of the laser output in the case where the RF drive is already detuned in absence of an external magnetic field.

The sensitivity of the laser threshold magnetometers for the magneto-encephalography device should be optimised given the following considerations: the laser pump and RF drive need to be low enough to not produce too much heat, since the laser threshold magnetometers in the device are positioned very close to the head. The sensor measurement range can be quite small since the signals from the brain are relatively small. Typically a measurement range around 1 pT at the point of detection is sufficient.

A magneto-encephalography device based on laser threshold magnetometers is highly sensitive and can be operated at room temperature. Accordingly the magneto-encephalography device of the present invention ameliorates a number of problems that have been identified in prior art magneto-encephalography devices.

It is to be understood that various alterations, additions and/or modifications may be made to the parts previously described without departing from the ambit of the present invention.

The invention claimed is:

1. A magneto-encephalography device including a plurality of laser threshold magnetometers for measuring a magnetic field, each laser threshold magnetometer including an optical cavity, a laser medium which together with the optical cavity has a laser threshold; a laser pump; and a radio-frequency (RF) drive applied to the laser medium at or around a resonance frequency which varies depending on the magnetic field, such that depending on the value of the magnetic field, the RF drive induces transitions between at least two states of the laser medium, each state causing a different laser threshold in an intensity of a laser output, wherein the intensity of the laser output is measured to provide a measurement of the magnitude of the magnetic field; wherein the laser threshold magnetometers are configured to be placed on a head of a subject to be monitored.

2. The magneto-encephalography device according to claim 1, wherein the plurality of laser threshold magnetometers are configured to be placed directly on the head of the subject in use.

3. The magneto-encephalography device according to claim 2, wherein the plurality of laser threshold magnetometers are arranged in an array within a shell having an inner surface and an outer surface, the inner surface being shaped to substantially surround at least a portion of the head of the subject.

4. The magneto-encephalography device according to claim 1, wherein the plurality of laser threshold magnetometers are configured to be individually placed directly on the head of the subject.

5. The magneto-encephalography device according to claim 1, wherein, each laser threshold magnetometer is configured to measure the magnetic field proximal to the location of the laser threshold magnetometer on the head of the subject and yields the laser output specific to that location.

6. The magneto-encephalography device according to claim 5, wherein the intensity of the laser output is representative of the strength and/or direction of the magnetic field at the location of the laser threshold magnetometer on the head of the subject.

7. The magneto-encephalography device according to claim 1, wherein each laser threshold magnetometer is directly coupled to an optical fibre, such that the laser output is guided into the optical fibre.

8. The magneto-encephalography device according to claim 7, wherein the optical fibres from the plurality of laser threshold magnetometers guide the laser output to at least one light detector, which measures the intensity of the laser output.

9. The magneto-encephalography device according to claim 8, wherein the laser threshold magnetometers are pumped via the laser pump through the same optical fibre, which guides the laser output.

10. The magneto-encephalography device according to claim 7, wherein at least part of the optical cavity of the laser threshold magnetometer is provided by the optic fibre itself.

* * * * *